(12) United States Patent
Tseng et al.

(10) Patent No.: US 8,685,820 B2
(45) Date of Patent: Apr. 1, 2014

(54) MULTIPLE GATE DIELECTRIC STRUCTURES AND METHODS OF FORMING THE SAME

(75) Inventors: Hsiao-Hui Tseng, Tainan (TW); Dun-Nian Yaung, Taipei (TW); Jen-Cheng Liu, Hsin-Chu (TW); Wen-I Hsu, Tainan (TW); Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 13/207,643

(22) Filed: Aug. 11, 2011

(65) Prior Publication Data

US 2013/0037890 A1    Feb. 14, 2013

(51) Int. Cl.
*H01L 21/336* (2006.01)

(52) U.S. Cl.
USPC .................. 438/261; 438/591; 438/981

(58) Field of Classification Search
None
See application file for complete search history.

(56) References Cited

U.S. PATENT DOCUMENTS

| 6,670,248 B1 * | 12/2003 | Ang et al. ............ 438/287 |
| 2005/0224793 A1 * | 10/2005 | Chang et al. ............ 257/59 |
| 2011/0140189 A1 * | 6/2011 | Kang ............ 257/321 |

* cited by examiner

*Primary Examiner* — Tan N Tran
*Assistant Examiner* — Scott R Wilson
(74) *Attorney, Agent, or Firm* — Haynes and Boone, LLP

(57) ABSTRACT

The present disclosure provides for multiple gate dielectric semiconductor structures and methods of forming such structures. In one embodiment, a method of forming a semiconductor structure includes providing a substrate including a pixel array region, an input/output (I/O) region, and a core region. The method further includes forming a first gate dielectric layer over the pixel array region, forming a second gate dielectric layer over the I/O region, and forming a third gate dielectric layer over the core region, wherein the first gate dielectric layer, the second gate dielectric layer, and the third gate dielectric layer are each formed to be comprised of a different material and to have a different thickness.

13 Claims, 6 Drawing Sheets

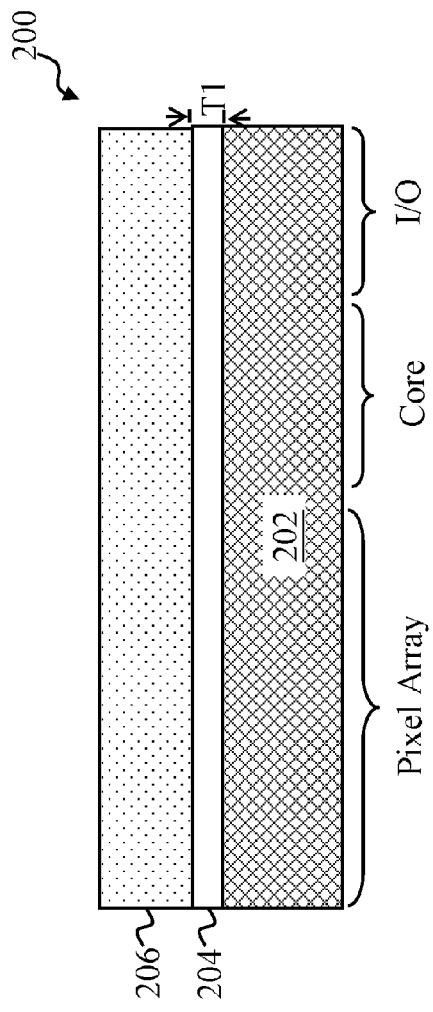
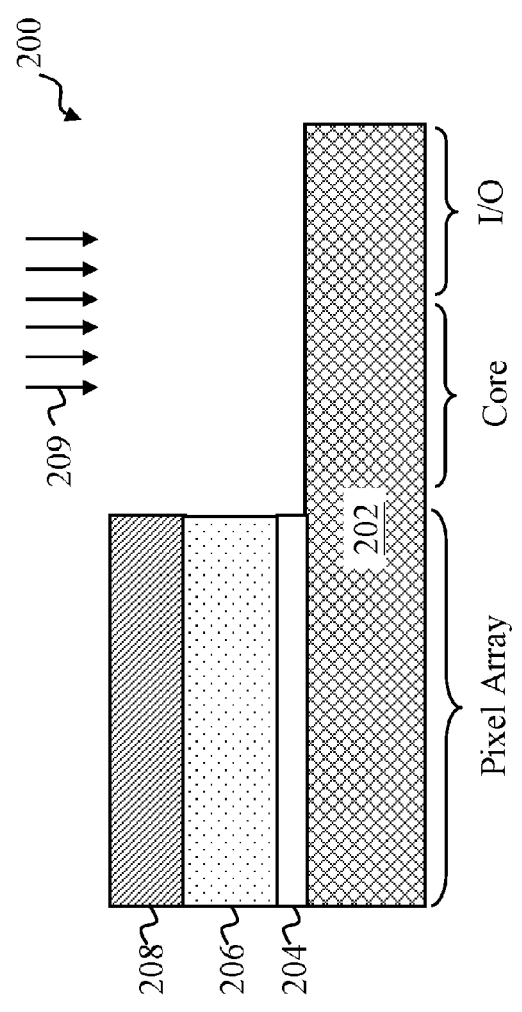
FIG. 2A
FIG. 2B

MULTIPLE GATE DIELECTRIC STRUCTURES AND METHODS OF FORMING THE SAME

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs.

During the manufacture of various types of monolithic ICs, such as high density metal oxide semiconductor field effect transistor (MOSFET) devices or complementary MOSFETS (CMOS) devices, having several thousand transistors fabricated in a single chip of silicon, there are many stages in a wafer processing sequence where it is desirable to provide a gate dielectric (a layer of a selected dielectric insulating material such as silicon dioxide, $SiO_2$, or silicon nitride, $Si_3N_4$, or a high-k material) to function as an insulating layer between a semiconductor substrate and a gate electrode.

Various materials have been used for the gate electrode and gate dielectric in field effect transistors (FET). One approach is to fabricate these devices with a polysilicon or metal material for the gate electrode. Depending upon the device desired to be fabricated, such as an analog or digital device, different gate dielectric layers comprised of different materials and having different thicknesses may be desired. Accordingly, for various devices fabricated over different regions of a semiconductor substrate, flexibility in the material and thickness of the device gate dielectric is desirable.

SUMMARY

The present disclosure provides for many different embodiments. According to one embodiment, a semiconductor structure includes a substrate including a pixel array region, an input/output (I/O or IO) region, and a core region; a first gate dielectric layer disposed over the pixel array region; a second gate dielectric layer disposed over the I/O region; and a third gate dielectric layer disposed over the core region. The first gate dielectric layer, the second gate dielectric layer, and the third gate dielectric layer are each comprised of a different material and each have a different thickness. The structure further includes a gate electrode disposed over each of the first gate dielectric layer, the second gate dielectric layer, and the third gate dielectric layer.

In another embodiment, a method for forming a semiconductor structure includes providing a substrate including a pixel array region, an input/output (I/O or IO) region, and a core region; forming a first gate dielectric layer over the pixel array region; forming a second gate dielectric layer over the I/O region; and forming a third gate dielectric layer over the core region, wherein the first gate dielectric layer, the second gate dielectric layer, and the third gate dielectric layer are each formed to be comprised of a different material and to have a different thickness.

In yet another embodiment, a method for forming a semiconductor structure includes providing a substrate including a pixel array region, an input/output (I/O or IO) region, and a core region; forming a first gate dielectric layer over the pixel array region, the I/O region, and the core region; forming a first polysilicon layer over the first gate dielectric layer over the pixel array region, the I/O region, and the core region; removing a portion of the first gate dielectric layer and the first polysilicon layer over the I/O region and the core region; forming a second gate dielectric layer over the pixel array region, the I/O region, and the core region; removing a portion of the second gate dielectric layer over the core region; forming a third gate dielectric layer over the pixel array region, the I/O region, and the core region; and forming a second polysilicon layer over the third gate dielectric layer over the pixel array region, the core region and the I/O region. The method further includes removing portions of the first polysilicon layer, the second polysilicon layer, the first gate dielectric layer, the second gate dielectric layer, and the third gate dielectric layer to define a pixel array device including a portion of the first gate dielectric layer and a portion of the first polysilicon layer over the pixel array region, an I/O region including a portion of the second gate dielectric layer, a portion of the third gate dielectric layer, and a portion of the second polysilicon layer over the I/O region, and a core device including a portion of the third gate dielectric layer and a portion of the second polysilicon layer over the core region, wherein the first gate dielectric layer, the second gate dielectric layer, and the third gate dielectric layer are each formed to be comprised of a different material and to have a different thickness

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 2A-2J are cross-sectional views of a semiconductor structure including multiple gate oxides at various stages of manufacture in accordance with embodiments of the present disclosure.

DETAILED DESCRIPTION

Figure 1:
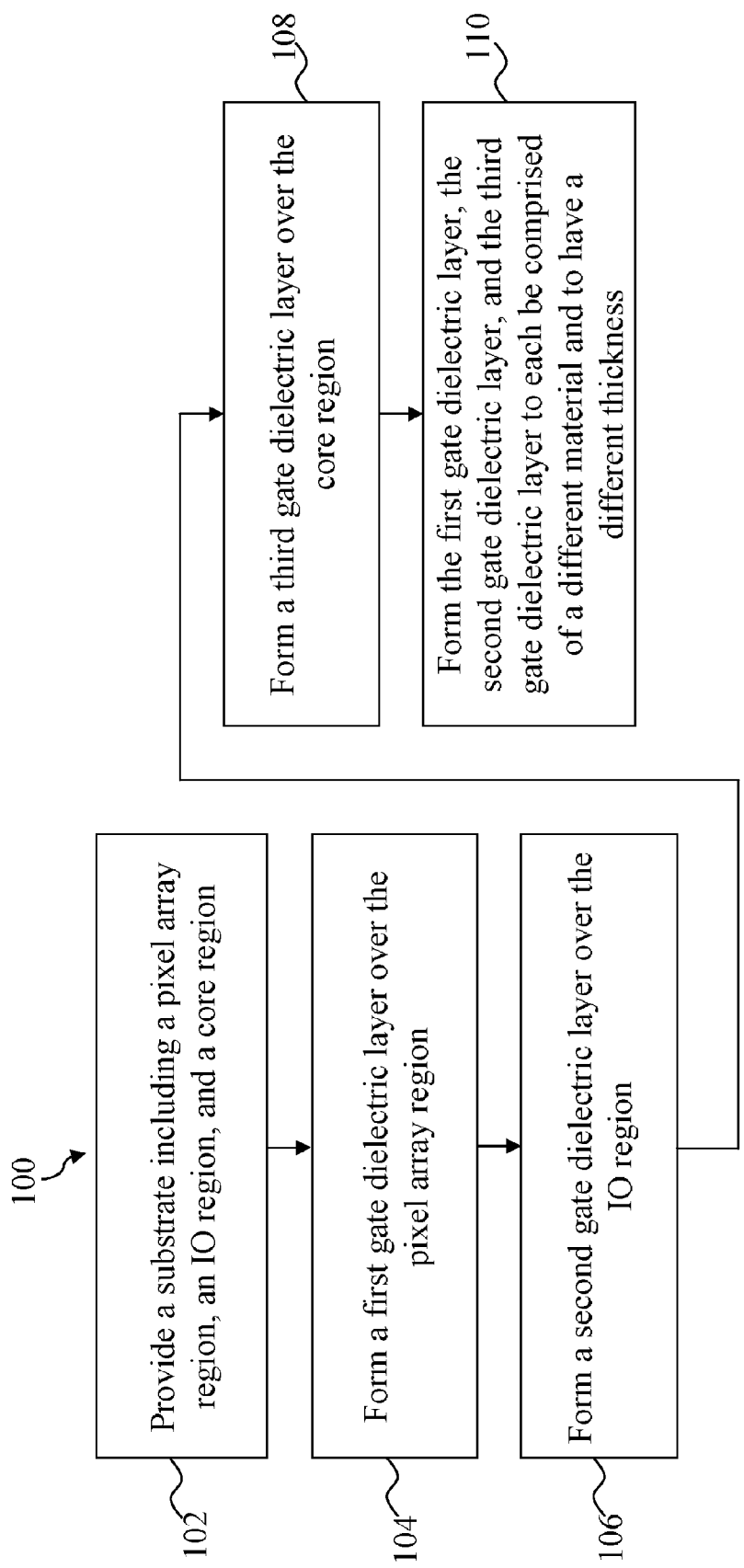
FIG. 1 is a flowchart illustrating a method for forming a semiconductor structure including multiple gate oxides in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first", "second", "third", and so on, may be used herein to describe various gate dielectric layers, gate electrode layers, and/or other layers, the gate dielectric layers, the gate electrode layers, and/or other layers should not be limited by these terms. These terms are only used to distinguish one layer from another layer. Thus, a first layer discussed below could be termed a second layer and vice versa without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart is shown illustrating a method 100 for forming a semiconductor structure including multiple gate dielectric layers in accordance with embodiments of the present disclosure. Method 100 includes providing a substrate including a pixel array region, an input/output (I/O) region, and a core region at block 102. Method 100 further includes forming a first gate dielectric layer over the pixel array region at block 104, forming a second gate dielectric layer over the I/O region at block 106, and forming a third gate dielectric layer over the core region at block 108. According to one aspect, the first gate dielectric layer, the second gate dielectric layer, and the third gate dielectric layer are each formed to be comprised of a different material and to have a different thickness at block 110.

The various steps in method 100 described above may be performed by various techniques, means, apparatus, and/or systems. It should be noted that the operations of method 100 may be rearranged or otherwise modified within the scope of the various aspects of the present disclosure. It is further noted that additional processes may be provided before, during, and after the operations of method 100, and that some other processes may only be briefly described herein. Thus, other implementations are possible within the scope of the various aspects described herein.

According to one aspect of the present disclosure, the substrate is divided into regions for forming different devices, such as pixel array devices in the pixel array region, an analog device in the I/O region, and a digital device in the core region. In one embodiment, the pixel array devices, the analog device, and the digital device may be or include MOSFETs, such as p-channel MOSFETs (pMOS transistors) utilizing high-k metal gate (HKMG) technology. In one example, the pixel array devices may include image sensors used for image sensing. The analog device may be used in an analog system such as a radio frequency (RF) device, input/output (I/O) device, or amplifier. The digital device may be used in a digital (or core) system such as a memory storage device (e.g. a static random access memory (SRAM)). Alternatively, the pixel array devices, analog devices, and digital devices may include other semiconductor devices of a known type such as n-channel MOSFETs (nMOS transistors).

According to another aspect of the present disclosure, the first, second, and third gate dielectric layers may be formed to be comprised of various materials, such as an oxide, nitride, an oxynitride, and/or a high-k material, and to each have a thickness between about 2 Å and about 500 Å. In one example, the first, second, and third gate dielectric layers may each be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride. The first, second, and third gate dielectric layers may be formed using any suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like. Depending upon the desired dielectric layer composition, various reactants may be selected, such as silane, diethylsilane, ammonia, oxygen, nitrous oxide, a fluorocarbon, and/or tetraethylorthosilicate (TEOS). Dilution and/or inert gases may also be selected, such as nitrogen, argon, and/or helium.

According to yet another aspect of the present disclosure, the method 100 may further include forming the first gate dielectric layer over the pixel array region, the I/O region, and the core region; forming a first polysilicon layer over the first gate dielectric layer over the pixel array region, the I/O region, and the core region; and removing a portion of the first gate dielectric layer and the first polysilicon layer over the I/O region and the core region.

According to yet another aspect of the present disclosure, the method 100 may further include forming the second gate dielectric layer over the pixel array region, the I/O region and the core region; and removing a portion of the second gate dielectric layer over the core region prior to forming the third gate dielectric layer over the core region.

According to yet another aspect of the present disclosure, the method 100 may further include forming the third gate dielectric layer over the pixel array region, the core region, and the I/O region; forming a second polysilicon layer over the third gate dielectric layer over the pixel array region, the core region, and the I/O region; and removing portions of the first polysilicon layer, the second polysilicon layer, the first gate dielectric layer, the second gate dielectric layer, and the third gate dielectric layer to define a pixel array device including a portion of the first gate dielectric layer and a portion of the first polysilicon layer over the pixel array region, an I/O region including a portion of the second gate dielectric layer, a portion of the third gate dielectric layer, and a portion of the second polysilicon layer over the I/O region, and a core device including a portion of the third gate dielectric layer and a portion of the second polysilicon layer over the core region.

According to yet another aspect of the present disclosure, the method 100 may further include portions of the first gate dielectric layer, the second gate dielectric layer, and the third gate dielectric layer are removed by etching through a hard mask to a top surface of the substrate.

Referring now to FIGS. 2A-2J, cross-sectional views are illustrated of a semiconductor structure 200 including multiple gate oxides at various stages of manufacture in accordance with embodiments of the present disclosure.

In FIG. 2A, semiconductor structure 200 includes a substrate 202, a first gate dielectric layer 204 disposed over the substrate 202, and a first gate electrode layer 206 disposed over the first gate dielectric layer 204.

According to one aspect of the present disclosure, the substrate 202 is divided into regions for forming different devices, such as a pixel array region for forming pixel array devices (e.g., image sensors), an input/output (I/O) region for forming analog devices (e.g., RF devices, I/O devices, and/or amplifiers), and a core region for forming digital devices (e.g., memory storage devices such as SRAM). The different devices may include MOSFETS, such as pMOS and/or nMOS transistors, which may or may not utilize high-k metal gate (HKMG) technology. Although in this embodiment, the core region and the I/O region are adjacent to one another, the different regions of substrate 202 may be spaced from one another, adjacent to one another, or at any other location in the integrated circuit. Accordingly, in FIG. 2A, first gate dielectric layer 204 and first gate electrode layer 206 are each formed over the pixel array region, the core region, and the I/O region of the substrate 202.

Substrate 202 may be comprised of silicon or alternatively, the substrate could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 202 may comprise active regions on which MOS devices can be formed. Typically, the boundaries of active regions are defined by isolation structures such as dielectrics of shallow trench isolation (STI) structures or local oxidation of silicon (LOCOS) structures. The isolation structures may be annular and extend around the devices of interest to prevent electrical interference or crosstalk between devices disposed on the substrate 202. In one example, the isolation structures may be composed of silicon oxide, but in other alternative embodiments, the dielectric material could be silicon nitride, silicon oxynitride, other suitable materials, and/or combinations thereof. The isolation structures may alternatively have a multi-layer structure such as a thermal oxide liner layer filled with silicon nitride or silicon oxide. Depending on where an active region is located, a non-oxide region may be referred as either an active region, which has active devices formed therein, or a dummy active region, which has no active devices formed therein. The active region may be configured as an NMOS device (e.g., nFET) or a PMOS device (e.g., pFET) in one example. Although not shown in FIGS. 2A-2J, semiconductor structure 200 may include isolation structures around the pixel array region, the core region, and/or the I/O region and their respective devices formed thereon.

Substrate 202 may further include underlying layers, devices, junctions, and other features (not shown) formed during prior process steps or which may be formed during subsequent process steps. For example, substrate 202 may further include doped regions such as a P-well and/or an N-well (not shown), and/or other features such as a buried layer, an epitaxy layer, a doped epitaxy layer, a gradient semiconductor layer, and/or may further include a semiconductor layer overlying another semiconductor layer of a different type, such as a silicon layer on a silicon germanium layer. In other examples, a compound semiconductor substrate may include a multilayer silicon structure or a silicon substrate may include a multilayer compound semiconductor structure.

First gate dielectric layer 204 may be comprised of various materials, such as $SiO_2$, oxynitride, nitride, and/or high-k materials. Thus, first gate dielectric layer 204 may be comprised of a high-k material, such as hafnium oxide (HfOx), hafnium silicon oxide (HfSiO), or hafnium silicon oxynitride (HfSiON), or dielectric layer 204 may be composed of a material with a standard dielectric constant, such as silicon oxide. In one example, the first gate dielectric layer may be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride. The first dielectric layer 204 has a thickness T1 ranging between about 2 Å and about 500 Å, in one example, but could alternatively have some other thickness. Although the dielectric layer 204 is illustrated as a single layer in FIG. 2A, it may optionally include additional layers such as an interfacial layer of silicon oxide between the substrate surface 202 and the remainder of the dielectric layer 204. First gate dielectric layer 204 may be formed over the substrate 202 using any suitable process, such as thermal oxidation, physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like.

First gate electrode layer 206 may be comprised of various materials, such as polysilicon or a metal. In one example, first gate electrode layer 206 is comprised of polysilicon, although it may also be a metal or metal compound comprising titanium, tungsten, cobalt, aluminum, nickel or combinations thereof. For the case gate electrode 206 is comprised of polysilicon, silane ($SiH_4$), di-silane ($Si_2H_6$), or di-chlorosilane ($SiCl_2H_4$) may be used as a chemical gas in a CVD process to form the polysilicon layer in one example. Alternatively, an amorphous silicon layer may optionally be formed instead of the polysilicon layer. The first gate electrode layer 206 may be formed over first gate dielectric layer 204 using any suitable process, such as thermal oxidation, physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like.

In FIG. 2B, the first gate dielectric layer 204 and the first gate electrode layer 206 are removed in the core region and the I/O region. In one example, the first gate dielectric layer 204 and the first gate electrode layer 206 may be removed through a photolithography process using a photoresist 208 and etch process 209. The photolithography patterning process may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. Other processes and techniques may be used to pattern the first gate dielectric layer 204 and the first gate electrode layer 206.

Figure 2C:
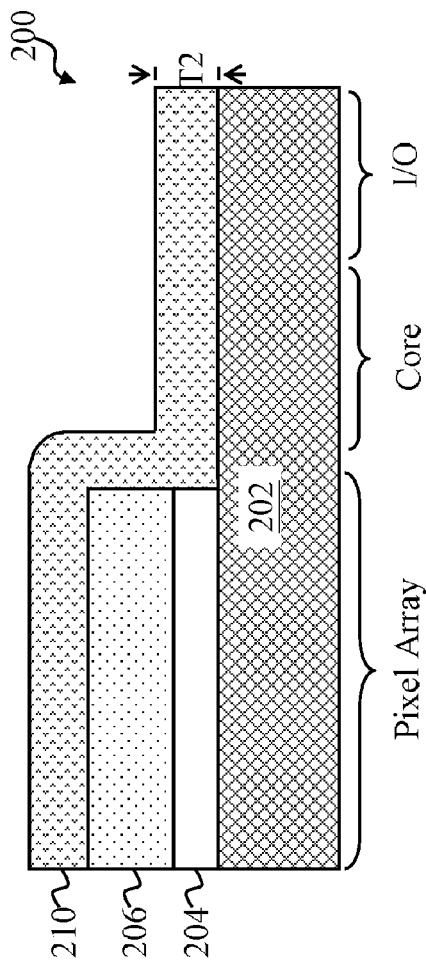

In FIG. 2C, a second gate dielectric layer 210 is formed over first gate electrode layer 206 in the pixel array region and over substrate 202 in the core region and the I/O region. The second gate dielectric layer 210 are composed of different materials from the materials of first gate dielectric layer 204, but it could alternatively be composed of similar materials. Thus, second gate dielectric layer 210 may be comprised of various materials, such as $SiO_2$, oxynitride, nitride, and/or high-k materials. In one example, the second gate dielectric layer may be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride. The second dielectric layer 210 has a thickness T2 ranging between about 2 Å and about 500 Å, in one example, but could alternatively have some other thickness. In one example, thickness T2 is greater than thickness T1 although in other embodiment, thickness T2 may be similar or less than thickness T1. Although the dielectric layer 210 is illustrated as a single layer in FIG. 2C, it may optionally include additional layers such as an interfacial layer of silicon oxide between the substrate surface 202 and the remainder of the dielectric layer 204. Second gate dielectric layer 210 may be formed using any suitable process, such as thermal oxidation, physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like.

Figure 2D:
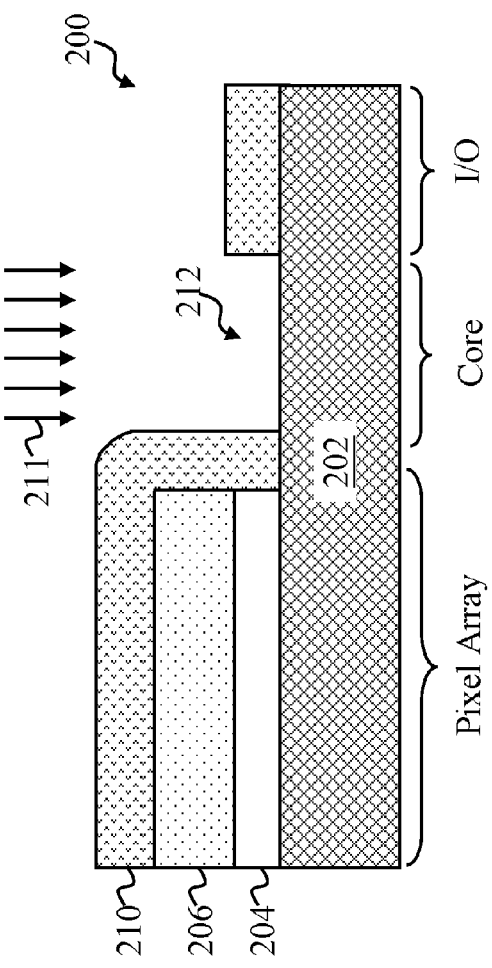

In FIG. 2D, the second gate dielectric layer 210 is removed in the core region. In one example, the second gate dielectric layer 210 may be removed through a photolithography process using a photoresist and etch process 211. The photolithography patterning process may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. Other processes and techniques may be used to pattern the second gate dielectric layer 210.

Figure 2E:
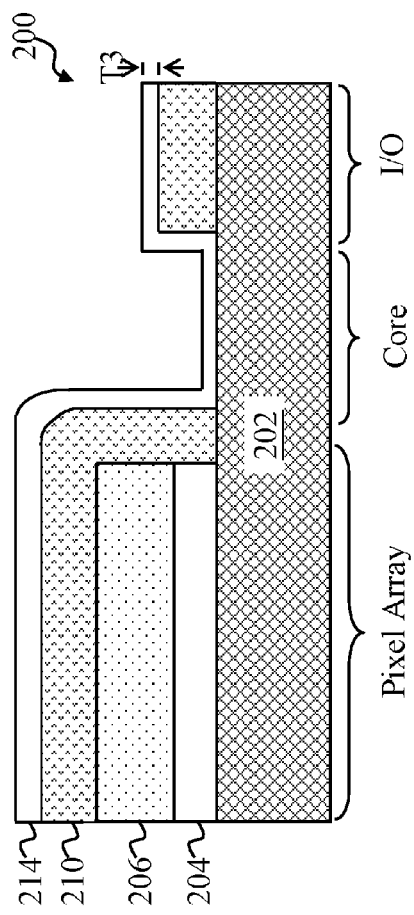

In FIG. 2E, a third gate dielectric layer 214 is formed over second gate dielectric layer 210 in the pixel array region and the I/O region and over substrate 202 in the core region. The third gate dielectric layer 214 is composed of different materials from the materials of first gate dielectric layer 204 and second gate dielectric layer 210, but it could alternatively be composed of similar materials to the first and/or second gate dielectric layers. Thus, third gate dielectric layer 214 may be comprised of various materials, such as $SiO_2$, oxynitride, nitride, and/or high-k materials. In one example, the third gate dielectric layer may be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride. Although the dielectric layer 214 is illustrated as a single layer in FIG. 2E, it may optionally include additional layers such as an interfacial layer of silicon oxide between the substrate surface 202 and the remainder of the dielectric layer 214. Third gate dielectric layer 214 may be formed using any suitable process, such as thermal oxidation, physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like.

The third dielectric layer 214 has a thickness T3 ranging between about 2 Å and about 500 Å, in one example, but could alternatively have some other thickness. In one example, thickness T3 is less than thickness T1 and/or T2, although in other embodiment, thickness T3 may be similar or greater than thickness T1 and/or T2. In one example, the thickness T2 of the analog device dielectric layer 210 is approximately 1.2 to 5 times larger than thickness T3 of the digital device dielectric layer 214. The exact ratio between the dielectric layer thicknesses T1, T2, and/or T3 may be related to the ratio between the respective operational voltages of the pixel array, analog, and digital devices. Thus, a semiconductor device with pixel array, analog and digital devices having dielectric layers of different respective thicknesses and/or different material compositions, as illustrated here, may form a triple gate dielectric device. With additional dielectric layer deposition-etch-deposition processes, a multiple gate dielectric device may be formed.

Figure 2F:
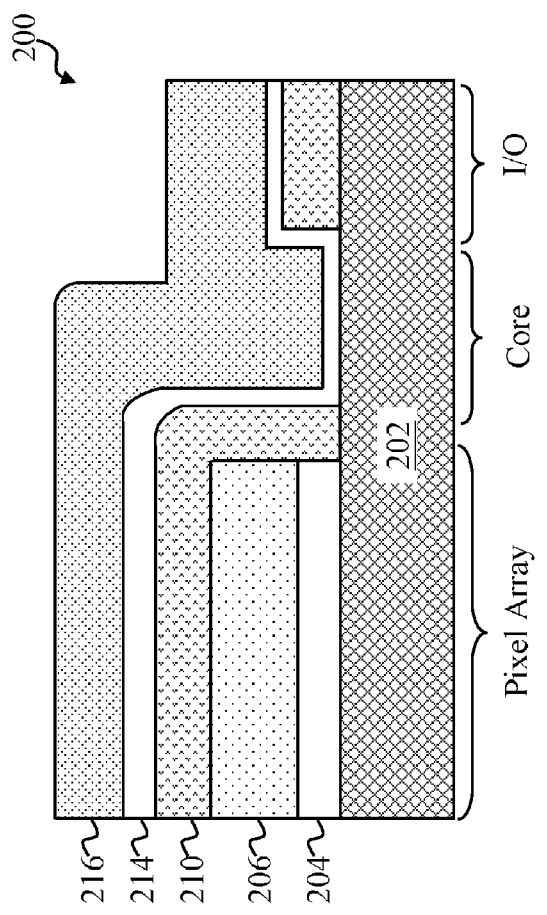

In FIG. 2F, a second gate electrode layer 216 is formed over third gate dielectric layer 214. The second gate electrode layer 216 may be comprised of various materials, such as polysilicon or a metal. In one example, second gate electrode layer 216 is comprised of polysilicon, although it may also be a metal or metal compound comprising titanium, tungsten, cobalt, aluminum, nickel or combinations thereof. For the case gate electrode 216 is comprised of polysilicon, silane ($SiH_4$), di-silane ($Si_2H_6$), or di-chlorosilane ($SiCl_2H_4$) may be used as a chemical gas in a CVD process to form the polysilicon layer in one example. Alternatively, an amorphous silicon layer may optionally be formed instead of the polysilicon layer. The second gate electrode layer 216 may be formed over third gate dielectric layer 214 using any suitable process, such as thermal oxidation, physical vapor deposition (PVD), atomic layer deposition (ALD), high density plasma CVD (HDPCVD), metal organic CVD (MOCVD), remote plasma CVD (RPCVD), plasma enhanced CVD (PECVD), other suitable methods, and/or combinations thereof, and using any suitable equipment or apparatus, such as a deposition/reaction chamber, power sources, impedance matching units, heating elements, pumps, and the like.

In FIGS. 2G, 2H, 2I, and 2J, portions of the first gate electrode layer 206, the second gate electrode layer 216, the first gate dielectric layer 204, the second gate dielectric layer 210, and the third gate dielectric layer 214 are removed to define a pixel array device 230 including a portion of the first gate dielectric layer 204 and a portion of the first gate electrode layer 206 over the pixel array region, an I/O device 232 including a portion of the second gate dielectric layer 210, a portion of the third gate dielectric layer 214, and a portion of the second gate electrode layer 216 over the I/O region, and a core device 234 including a portion of the third gate dielectric layer 214 and a portion of the second gate electrode layer 216 over the core region.

Figure 2G:
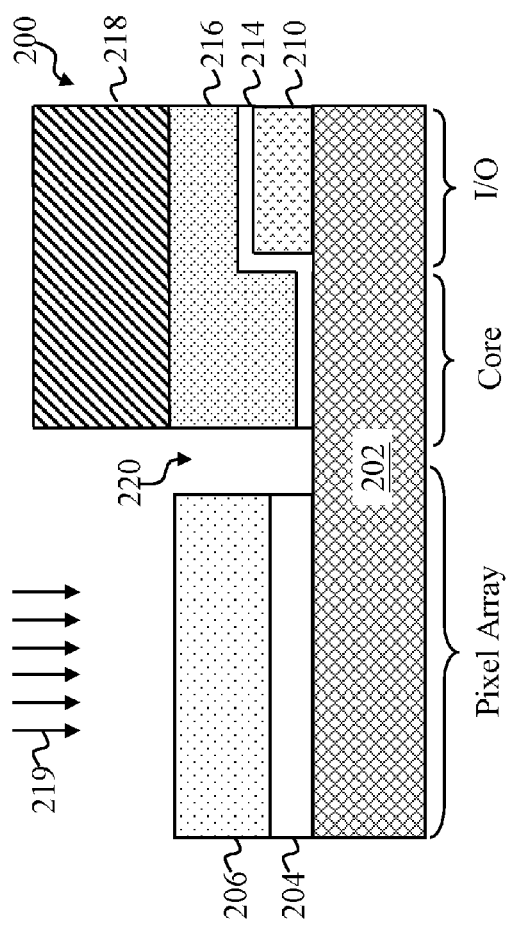

In FIG. 2G, the second gate dielectric layer 210, the third gate dielectric layer 214, and the second gate electrode layer 216 are removed in the pixel array region to form a trench 220. In one example, the second gate dielectric layer 210, the third gate dielectric layer 214, and the second gate electrode layer 216 may be removed through a photolithography process using a photoresist 218 and etch process 219, and/or through a combination with a planarization process, such as by chemical-mechanical planarization.

Figure 2H:
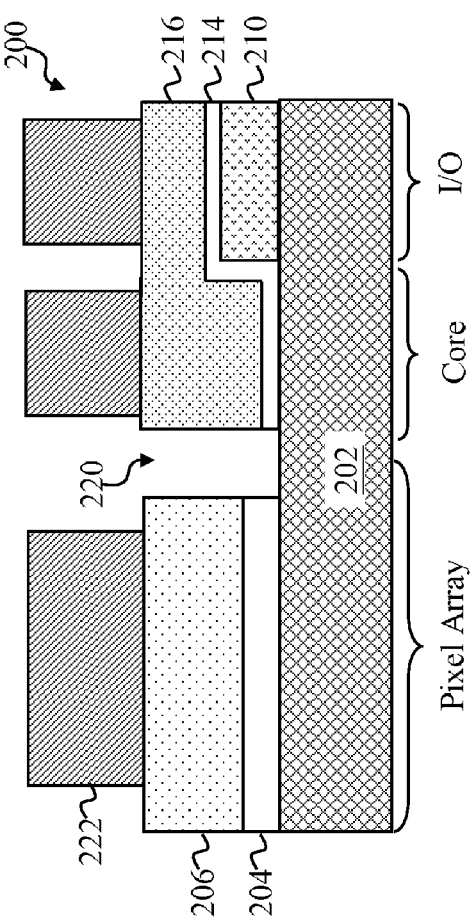
Figure 2I:
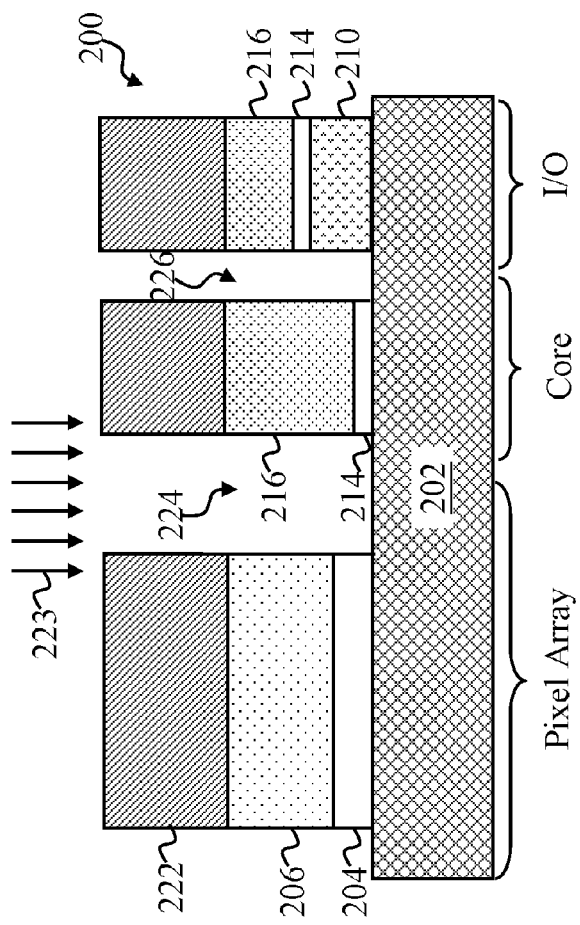

In FIGS. 2H and 2I, the first gate dielectric layer 204, the second gate dielectric layer 210, the third gate dielectric layer 214, the first gate electrode layer 206, and the second gate electrode layer 216 are patterned in the pixel array, core and I/O regions of substrate 202, in one example to form trenches 224 and 226. In one example, the first gate dielectric layer 204, the second gate dielectric layer 210, the third gate dielectric layer 214, the first gate electrode layer 206, and the second gate electrode layer 216 may be removed through a photolithography process using a photoresist 222 and etch process 223, and/or through a combination with a planarization process, such as by chemical-mechanical planarization.

The photolithography patterning processes described above with respect to FIGS. 2B, 2D, 2G, and 2I may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. The patterned photoresist may be formed by photolithography, immersion lithography, ion-beam writing, or other suitable techniques. Furthermore, an anti-reflective coating (ARC) may be formed under or on top of the photoresist to absorb light and provides ultimate critical dimension control. The material of the ARC depends on the material of the photoresist and may be organic materials or in-organic materials, such as $SiO_xN_y$ and SiN formed of low-pressure chemical vapor deposition (LPCVD) or plasma-enhanced chemical vapor deposition (PECVD), and oxide. Further, the photolithography exposing process may be wholly replaced by other proper methods, such as maskless photolithography, electron-beam writing, or ion-beam writing. Other processes and techniques may be used to pattern the layers as well.

The patterned removal of the various layers described above may be accomplished by a dry etching, wet etching, or combination dry and wet etching process. For example, a wet etching process may include exposure to a hydroxide containing solution (e.g., ammonium hydroxide), de-ionized water, and/or other suitable etchant solutions. Etching the polysilicon layer may be performed using HBr, $CF_4$, $Cl_2$, O2 or $HeO_2$ at a temperature of about 0° C.-100° C. Furthermore, the layers may be removed in a single-step etching process or multiple-step etching process. It is understood that other etching chemicals may be used for selective removal.

Figure 2J:
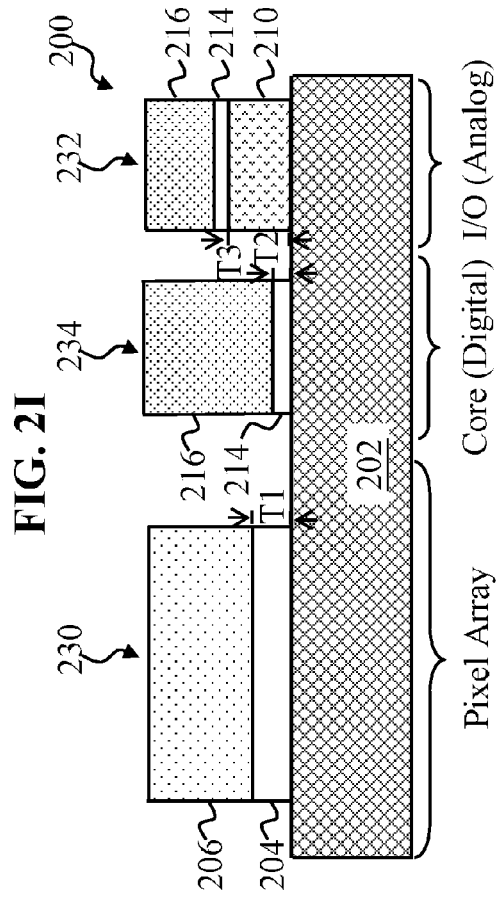

In FIG. 2J, as noted above, semiconductor structure 200 includes pixel array device 230 including a portion of the first gate dielectric layer 204 and a portion of the first gate electrode layer 206 over the pixel array region, I/O device 232 including a portion of the second gate dielectric layer 210, a portion of the third gate dielectric layer 214, and a portion of the second gate electrode layer 216 over the I/O region, and core device 234 including a portion of the third gate dielectric layer 214 and a portion of the second gate electrode layer 216 over the core region. It is also understood that the semiconductor structure may undergo further processing to form various features such as contacts/vias, interconnect metal layers, interlayer dielectric, passivation layers, inductors, capacitors, etc. before or after the method outlined in FIG. 1.

For example, semiconductor structure 200 may be processed to include source and drain regions within substrate 202 for each of the devices 230, 232, and/or 234. In one example, these source and drain regions may be doped wells having a dopant implanted therein that is appropriate for the design requirements of the associated device. For example, as parts of pMOS transistors, source and drain regions may be p-type wells doped with p-type dopants such as boron or BF2 or combinations thereof. Alternatively, if the source and drain regions are parts of nMOS transistors, they may be n-type wells doped with n-type dopants, such as phosphorus or arsenic, or combinations thereof.

A channel region may be defined between the source region and the drain region in the substrate 202 for each respective device. The channel regions are active regions in the substrate 202 in which the majority carriers (e.g., holes) flow between the source and drain regions when a device is in a conduction mode.

Gate spacers may also be formed to abut each side of a respective dielectric layer and gate electrode. The gate spacers may be comprised of a dielectric material, such as silicon nitride. Alternatively, the gate spacers may be silicon carbide, silicon oxynitride, other suitable materials, and/or combinations thereof. Also, they may each be composed of a different material. Gate contacts may also be formed to engage the formed devices.

Furthermore, for the case that the devices are HKMG devices, the devices may each have a plurality of layers above their respective dielectric layers including barrier layers and work function layers.

Thus, the present disclosure provides for various embodiments. According to one embodiment, a semiconductor structure including multiple gate oxides is provided. The structure includes a substrate including a pixel array region, an input/output (I/O) region, and a core region; a first gate dielectric layer disposed over the pixel array region; a second gate dielectric layer disposed over the I/O region; and a third gate dielectric layer disposed over the core region. The first gate dielectric layer, the second gate dielectric layer, and the third gate dielectric layer are each comprised of a different material and each have a different thickness. The structure further includes a gate electrode disposed over each of the first gate dielectric layer, the second gate dielectric layer, and the third gate dielectric layer.

In another embodiment, a method for forming a semiconductor structure includes providing a substrate including a pixel array region, an input/output (I/O) region, and a core region; forming a first gate dielectric layer over the pixel array region; forming a second gate dielectric layer over the I/O region; and forming a third gate dielectric layer over the core region, wherein the first gate dielectric layer, the second gate dielectric layer, and the third gate dielectric layer are each formed to be comprised of a different material and to have a different thickness.

In yet another embodiment, a method for forming a semiconductor structure includes providing a substrate including a pixel array region, an input/output (I/O) region, and a core region; forming a first gate dielectric layer over the pixel array region, the I/O region, and the core region; forming a first polysilicon layer over the first gate dielectric layer over the pixel array region, the I/O region, and the core region; removing a portion of the first gate dielectric layer and the first polysilicon layer over the I/O region and the core region; forming a second gate dielectric layer over the pixel array region, the I/O region, and the core region; removing a portion of the second gate dielectric layer over the core region; forming a third gate dielectric layer over the pixel array region, the I/O region, and the core region; and forming a second polysilicon layer over the third gate dielectric layer over the pixel array region, the core region and the I/O region. The method further includes removing portions of the first polysilicon layer, the second polysilicon layer, the first gate dielectric layer, the second gate dielectric layer, and the third gate dielectric layer to define a pixel array device including a portion of the first gate dielectric layer and a portion of the first polysilicon layer over the pixel array region, an I/O region including a portion of the second gate dielectric layer, a portion of the third gate dielectric layer, and a portion of the second polysilicon layer over the I/O region, and a core device including a portion of the third gate dielectric layer and a portion of the second polysilicon layer over the core region, wherein the first gate dielectric layer, the second gate dielectric layer, and the third gate dielectric layer are each formed to be comprised of a different material and to have a different thickness.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of forming a semiconductor structure, the method comprising:
   providing a substrate including a pixel array region, an input/output (I/O) region, and a core region;
   forming a first gate dielectric layer over the pixel array region;
   forming a second gate dielectric layer over the I/O region; and
   forming a third gate dielectric layer over the core region and the I/O region,
   wherein the first gate dielectric layer, the second gate dielectric layer, and the third gate dielectric layer are each formed to be comprised of a different material and to have a different thickness.

2. The method of claim 1, wherein the first gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

3. The method of claim 1, wherein the second gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

4. The method of claim 1, wherein the third gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

5. The method of claim 1, further comprising:
   forming the first gate dielectric layer over the pixel array region, the I/O region, and the core region;
   forming a first polysilicon layer over the first gate dielectric layer over the pixel array region, the I/O region, and the core region; and
   removing a portion of the first gate dielectric layer and the first polysilicon layer over the I/O region and the core region.

6. The method of claim 5, further comprising:
   forming the third gate dielectric layer over the pixel array region, the core region, and the I/O region;
   forming a second polysilicon layer over the third gate dielectric layer over the pixel array region, the core region, and the I/O region; and
   removing portions of the first polysilicon layer, the second polysilicon layer, the first gate dielectric layer, the second gate dielectric layer, and the third gate dielectric layer to define a pixel array device including a portion of the first gate dielectric layer and a portion of the first polysilicon layer over the pixel array region, an I/O region including a portion of the second gate dielectric layer, a portion of the third gate dielectric layer, and a portion of the second polysilicon layer over the I/O region, and a core device including a portion of the third gate dielectric layer and a portion of the second polysilicon layer over the core region.

7. The method of claim 6, wherein portions of the first gate dielectric layer, the second gate dielectric layer, and the third gate dielectric layer are removed by etching through a hard mask to a top surface of the substrate.

8. The method of claim 1, further comprising:
   forming the second gate dielectric layer over the pixel array region, the I/O region and the core region; and
   removing a portion of the second gate dielectric layer over the core region prior to forming the third gate dielectric layer over the core region.

9. A method of forming a semiconductor structure, the method comprising:
- providing a substrate including a pixel array region, an input/output (I/O) region, and a core region;
- forming a first gate dielectric layer over the pixel array region, the I/O region, and the core region;
- forming a first polysilicon layer over the first gate dielectric layer over the pixel array region, the I/O region, and the core region;
- removing a portion of the first gate dielectric layer and the first polysilicon layer over the I/O region and the core region;
- forming a second gate dielectric layer over the pixel array region, the I/O region, and the core region;
- removing a portion of the second gate dielectric layer over the core region;
- forming a third gate dielectric layer over the pixel array region, the I/O region, and the core region;
- forming a second polysilicon layer over the third gate dielectric layer over the pixel array region, the core region and the I/O region; and
- removing portions of the first polysilicon layer, the second polysilicon layer, the first gate dielectric layer, the second gate dielectric layer, and the third gate dielectric layer to define a pixel array device including a portion of the first gate dielectric layer and a portion of the first polysilicon layer over the pixel array region, an I/O region including a portion of the second gate dielectric layer, a portion of the third gate dielectric layer, and a portion of the second polysilicon layer over the I/O region, and a core device including a portion of the third gate dielectric layer and a portion of the second polysilicon layer over the core region, wherein the first gate dielectric layer, the second gate dielectric layer, and the third gate dielectric layer are each formed to be comprised of a different material and to have a different thickness.

10. The method of claim 9, wherein the first gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

11. The method of claim 9, wherein the second gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

12. The method of claim 9, wherein the third gate dielectric layer is formed to be comprised of silicon oxide, silicon nitride, oxynitride, hafnium oxide (HfOx), hafnium silicon oxide (HfSiO), hafnium silicon oxynitride (HfSiON), aluminum oxide, aluminum oxynitride, or silicon aluminum oxynitride, and to have a thickness between about 2 Å and about 500 Å.

13. The method of claim 9, wherein portions of the first gate dielectric layer, the second gate dielectric layer, and the third gate dielectric layer are removed by etching through a hard mask to a top surface of the substrate.

* * * * *